(12) United States Patent
Yang et al.

(10) Patent No.: US 8,281,268 B2
(45) Date of Patent: Oct. 2, 2012

(54) METHOD AND SYSTEM DETECTING METAL LINE FAILURE

(75) Inventors: Gi-Young Yang, Hwaseong-si (KR); Se-Young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 237 days.

(21) Appl. No.: 12/635,873

(22) Filed: Dec. 11, 2009

(65) Prior Publication Data

US 2010/0169855 A1  Jul. 1, 2010

(30) Foreign Application Priority Data

Dec. 31, 2008 (KR) .................. 10-2008-0137747

(51) Int. Cl.
*G06F 17/50* (2006.01)

(52) U.S. Cl. ........ 716/111; 716/107; 716/133; 716/136; 703/16

(58) Field of Classification Search .................. 716/111, 716/107, 133, 136; 703/16
See application file for complete search history.

(56) References Cited

U.S. PATENT DOCUMENTS

| | | | | |
|---|---|---|---|---|
| 4,811,237 A * | 3/1989 | Putatunda et al. | ............ | 716/127 |
| 6,530,065 B1 * | 3/2003 | McDonald et al. | ........... | 716/102 |
| 6,857,113 B2 * | 2/2005 | Gentry et al. | .................. | 716/113 |
| 7,079,998 B2 * | 7/2006 | Tien et al. | ....................... | 703/18 |
| 7,089,129 B2 * | 8/2006 | Habitz | ........................... | 702/65 |
| 7,096,450 B2 * | 8/2006 | Gill et al. | ....................... | 716/115 |
| 7,155,686 B2 * | 12/2006 | Hou et al. | ...................... | 716/112 |
| 7,200,829 B2 * | 4/2007 | Kozhaya et al. | .............. | 716/112 |
| 7,721,245 B2 * | 5/2010 | Maziasz et al. | ............... | 716/129 |
| 7,752,582 B2 * | 7/2010 | Jain et al. | ...................... | 716/107 |
| 7,984,409 B2 * | 7/2011 | Hsu et al. | ...................... | 716/119 |
| 8,056,039 B2 * | 11/2011 | Chanda et al. | ................ | 716/115 |
| 2002/0120906 A1 * | 8/2002 | Xia et al. | .......................... | 716/2 |
| 2003/0115558 A1 * | 6/2003 | Hilton | ............................... | 716/4 |
| 2003/0195736 A1 * | 10/2003 | Ghosh et al. | .................... | 703/14 |
| 2004/0049750 A1 * | 3/2004 | Gentry et al. | .................... | 716/5 |
| 2005/0177807 A1 * | 8/2005 | Ma et al. | ........................... | 716/5 |
| 2005/0204314 A1 * | 9/2005 | Hou et al. | ........................ | 716/2 |
| 2005/0278662 A1 * | 12/2005 | Kartschoke et al. | .............. | 716/4 |
| 2005/0289494 A1 * | 12/2005 | Kozhaya et al. | ................ | 716/11 |
| 2008/0086708 A1 * | 4/2008 | Rittman | .......................... | 716/11 |
| 2008/0086709 A1 * | 4/2008 | Rittman | .......................... | 716/11 |

(Continued)

FOREIGN PATENT DOCUMENTS

JP  11067861 A  *  3/1999

(Continued)

OTHER PUBLICATIONS

Sedra et al., "Microelectronic Circuits", Saunders College Publishing, 3rd Edition, 1991, pp. 322-348).*

*Primary Examiner* — Phallaka Kik
(74) *Attorney, Agent, or Firm* — Volentine & Whitt, PLLC (57) ABSTRACT

In a method of detecting metal line failures for a full-chip, a first net-list is converted to a second net-list. The first net-list includes first information related to elements and metal lines, and the second net-list includes second information susceptible to direct current analysis. Current densities of the metal lines are calculated by performing the direct current analysis on the second net-list. Defective metal lines among the metal lines are detected based on the current densities of the metal lines.

14 Claims, 9 Drawing Sheets

U.S. PATENT DOCUMENTS

| | | |
|---|---|---|
| 2008/0092100 A1* | 4/2008 | Maziasz et al. ............... 716/13 |
| 2008/0120580 A1* | 5/2008 | Hsu et al. ..................... 716/5 |
| 2008/0133203 A1* | 6/2008 | Yang et al. ................... 703/14 |
| 2008/0300848 A1* | 12/2008 | Beattie et al. ............... 703/14 |
| 2009/0031264 A1* | 1/2009 | Rittman et al. ............... 716/5 |
| 2009/0132972 A1* | 5/2009 | Jain et al. ..................... 716/4 |
| 2009/0187869 A1* | 7/2009 | Jain et al. ..................... 716/6 |
| 2009/0278260 A1* | 11/2009 | Hsu et al. ..................... 257/767 |
| 2010/0038783 A1* | 2/2010 | Yang et al. ................... 257/751 |

FOREIGN PATENT DOCUMENTS

| | | |
|---|---|---|
| JP | 2001349920 A | 12/2001 |
| JP | 2008028416 A | 2/2008 |
| JP | 2008128678 A | 6/2008 |

* cited by examiner

METHOD AND SYSTEM DETECTING METAL LINE FAILURE

CROSS-REFERENCE TO RELATED APPLICATION(S)

This application claims priority under 35 USC §119 to Korean Patent Application No. 10-2008-0137747 filed on Dec. 31, 2008, the subject matter of which is hereby incorporated by reference.

BACKGROUND

The inventive concept relates to a full-chip design test and evaluation procedure. More particularly, the inventive concept relates to methods and systems detecting metal line failures in a full-chip design.

Generally, a full-chip operates abnormally when defects, such as metal line failures and/or discrete element (e.g., field effect transistors) failures are present in a completed device. Such failures may be caused by electro static discharge (ESD) inadvertently applied to the full-chip during fabrication, packaging, or related handling. In order to prevent damage from ESD, a full-chip may include certain specialized protection circuit(s) that shield discrete elements and/or associated metal lines from ESD. Unfortunately, the provision of these ESD protection circuits increases the overall size of the full-chip (i.e., reduces the overall degree of integration) and slows performance.

Although many approaches have been suggested for detecting failures during various stages of a full-chip design process, only a design rule check has conventionally been applied to identify metal line failures. In a design rule check, metal line failures may be detected by determining whether the widths of metal lines are less than a corresponding design rule. Unfortunately, the accuracy of the design rule check is low and may only be applied over a relatively narrow detection area. Thus, the design rule check is relatively ineffective and inefficient in detecting metal line failures in the full-chip design phase.

SUMMARY

Embodiments of the inventive concept provide a method of detecting metal line failures due to electro static discharge in a full-chip design phase. Such embodiments are capable of rapidly and accurately detecting metal line failures and detecting metal line failure within internal circuits. Embodiments of the inventive concept also provide systems capable of detecting metal line failures due to electro static discharge in a full-chip design phase, of rapidly and accurately detecting metal line failures, and of detecting metal line failures within internal circuits.

According to certain embodiments, in a method of detecting metal line failures for a full-chip, a first net-list may be converted to a second net-list. The first net-list may include first information related to elements and metal lines, and the second net-list may include second information susceptible to direct current analysis. Current densities for the metal lines may be calculated by performing the direct current analysis on the second net-list. Defective metal lines may be detected among the metal lines based on the current densities of the metal lines.

In some embodiments, the first net-list may be generated by modifying an external net-list inputted from an external device. In other embodiments, the first net-list may be generated based on a layout of the full-chip.

In some embodiments, the elements may correspond to field effect transistors and capacitors. The metal lines may correspond to first resistors.

In some embodiments, the field effect transistors may be transformed to second resistors, the capacitors may be transformed to open circuits, and a current source may be added between an input pin and a ground pin when the first net-list is converted to the second net-list comprises.

In some embodiments, the current source may provide a current having a maximum value of discharge currents caused by an electro static discharge (ESD) event.

In some embodiments, drain currents of the field effect transistors may be calculated, voltage differences between drain terminals and source terminals of the field effect transistors may be calculated, and resistances of the second resistors are determined by dividing the drain currents by the voltage differences when the field effect transistors are transformed to the second resistors.

In some embodiments, the metal lines may be determined as the defective metal lines if the current densities of the metal lines are greater than a reference value when detecting the defective metal lines among the metal lines.

In some embodiments, widths of the defective metal lines may be increased to repair the defective metal lines.

According to some example embodiments, a system of detecting metal line failures for a full-chip may include a conversion unit that converts a first net-list to a second net-list, a simulation unit that calculates current densities of the metal lines by performing a direct current analysis on the second net-list, and a detection unit that detect defective metal lines among the metal lines based on the current densities of the metal lines. The first net-list may include first information related to elements and the metal lines, and the second net-list may include second information susceptible to direct current analysis. The elements may correspond to field effect transistors and capacitors. The metal lines may correspond to first resistors. The metal lines may be determined as the defective metal lines when the current densities of the metal lines are greater than a reference value.

In some embodiments, the system may further include an interface unit that generates the first net-list by modifying an external net-list inputted from an external device.

In some embodiments, the system may further include a generation unit that generates the first net-list based on a layout of the full-chip.

In some embodiments, the conversion unit may transform the field effect transistors to second resistors, may transform the capacitors to open circuits, and may add a current source between an input pin and a ground pin. The current source may provide a current having a maximum value of discharge currents caused by an electro static discharge (ESD) event.

In some embodiments, the conversion unit may calculate drain currents of the field effect transistors, may calculate voltage differences between drain terminals and source terminals of the field effect transistors, and may determine resistances of the second resistors by dividing the drain currents by the voltage differences.

In some embodiments, the system may further include a repair unit that generates a final net-list from the first net-list by increasing widths of the defective metal lines to repair the defective metal lines.

In some embodiments, the system may further include a repair unit that generates a third net-list from the second net-list by increasing widths of the defective metal lines to repair the defective metal lines.

In some embodiments, the system may further include an inverse conversion unit that generates a final net-list from the third net-list by transforming the second resistors to the field effect transistors, transforming the open circuits to the capacitors, and removing the current source.

According to some example embodiments, in a method of detecting full-chip failures for a full-chip, defective metal lines may be detected by performing a direct current analysis on a second net-list converted from a first net-list. The first net-list may include first information related to elements and metal lines, and the second net-list may include second information susceptible to direct current analysis. The elements may correspond to field effect transistors and capacitors. The metal lines may correspond to first resistors. Defective field effect transistors may be detected by performing an element analysis on a fourth net-list. The fourth net-list may be converted from the first net-list by transforming the field effect transistors to modeling circuits.

In some embodiments, the second net-list may be converted from the first net-list by transforming the field effect transistors to second resistors, transforming the capacitors to open circuits, and adding a current source between an input pin and a ground pin. The current source may provide a current having a maximum value of discharge currents caused by an electro static discharge (ESD) event.

In some embodiments, current densities of the metal lines may be calculated by performing the direct current analysis on the second net-list, and the defective metal lines may be detected among the metal lines based on the current densities of the metal lines when the defective metal lines are detected. The metal lines may be determined as the defective metal lines when the current densities of the metal lines are greater than a reference value.

According to some example embodiments, a method of detecting metal line failures for a full-chip may rapidly and accurately detect metal line failures due to electro static discharges, and may detect even metal line failures of an internal circuit due to electro static discharges in a full-chip design phase.

According to some example embodiments, a system of detecting metal line failures for a full-chip may rapidly and accurately detect metal line failures due to electro static discharges, and may detect even metal line failures of an internal circuit due to electro static discharges in a full-chip design phase.

According to some example embodiments, a method of detecting full-chip failures for a full-chip may rapidly and accurately detect metal line failures and elements (e.g., field effect transistors) failures due to electro static discharges, and may detect even metal line failures and even elements failures of an internal circuit due to electro static discharges in a full-chip design phase.

As described above, a full-chip design may be performed considering electro static discharges by the method of detecting metal line failures for a full-chip, the system of detecting metal line failures for a full-chip, and the method of detecting full-chip failures for a full-chip.

BRIEF DESCRIPTION OF THE DRAWINGS

Illustrative, non-limiting embodiments will be described in conjunction with the accompanying drawings, in which.

DETAILED DESCRIPTION OF THE EMBODIMENTS

Embodiments of the inventive concept will now be described in some additional detail with reference to the accompanying drawings. The inventive concept may, however, be embodied in many different forms and should not be construed as being limited to only the illustrated embodiments. Rather, these embodiments are presented as teaching examples. Throughout the written description and drawings, like reference numbers and labels refer to like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
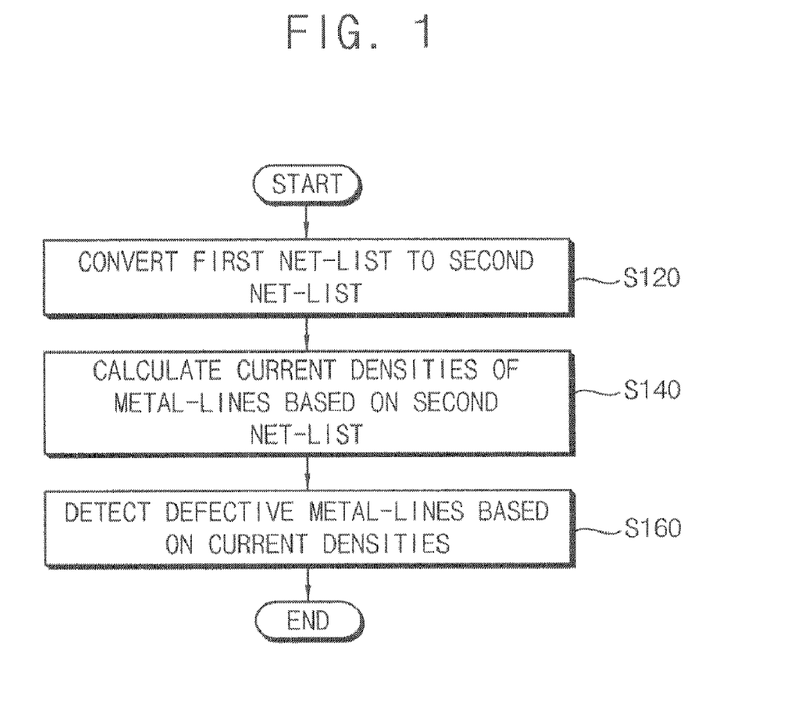
FIG. 1 is a flow diagram summarizing a method of detecting metal line failures in a full-chip according to an embodiment of the inventive concept.

FIG. 1 is a flow diagram summarizing a method of detecting metal line failures in a full-chip according to certain embodiments of the inventive concept.

Referring to FIG. 1, in the method generally comprises; converting a first net-list to a second net-list (S120), calculating current densities of metal lines by performing a direct current analysis on the second net-list (S140), and detecting defective metal lines among the metal lines based on the current densities of the metal lines (S160). Such metal line failures may be caused by electro static discharge (ESD), and may be indicated when the current densities of the metal lines are greater than a defined reference value. The method summarized in FIG. 1 may be performed in a full chip design phase to detect defective metal lines. Hereinafter, the method of FIG. 1 will be described in some additional detail.

The exemplary method described above begins by converting a first net-list to a second net-list (S120). The first net-list may be viewed as including "first information" related to various discrete and distributed elements, as well as related metal lines. In similar manner, the second net-list includes "second information" susceptible to direct current analysis. It is common for a "full-chip design" to include certain discrete elements such as field effect transistors (FETs) and capacitors (CAPS) connected by metal lines which may be electrically modeled as resistive components (or "first resistors"). When the first net-list is converted to the second net-list, the FETs in the first net-list may be electrically modeled (or "transformed") as "second resistors" within the second net-list. The CAPS in the first net-list may be transformed as open circuits within the second net-list. That is, the CAPs are essentially removed from the second net-list when the first net-list is transformed.

Additionally, a current source may be added between an input pin and a ground pin in the first net-list. As a result, the second net-list may include second information related to first resistors, second resistors, and current source(s)—each susceptible to direct current analysis.

The respective current densities for the metal lines may now be calculated by performing direct current analysis on the second net-list (S140). Direct current analysis, as is conventionally understood, is performed on the second net-list following transformation of the first net-list. The current densities for the metal lines (i.e., the first resistors) are calculated based on the direct current analysis. That is, the current densities of the metal lines may be calculated using a quantitative analysis approach, because the second net-list only includes second information related to first resistors, second resistors, and current source(s). Thus, the current densities for the metal lines may be calculated in one approach by dividing currents flowing through the metal lines by the corresponding widths of the metal lines. The term "width" in this context may be variously defined, but in one embodiment the width of a metal line is substantially equal to its cross-sectional area.

Defective metal lines may now be detected from among the metal lines based on the respectively calculated current densities (S160). Excessive current flowing through a metal line is typically generated by ESD. Thus, a metal line failure may be caused when a current density for the metal line is greater than a reference value. Such reference values may be readily defined by chip designers and may be adjusted to account for numerous full-chip design conditions and factors. In this manner, a defective metal line may be detected when a corresponding current density for the metal line is greater than a reference value.

The method of FIG. 1 is adapted to rapidly and accurately detect metal line failures based on the direct current analysis, and may further detect metal line failures within an internal circuit. As a result, the method of FIG. 1 may be applied to the problem of ESD applied to a full-chip design during the full-chip design phase.

Figure 2:
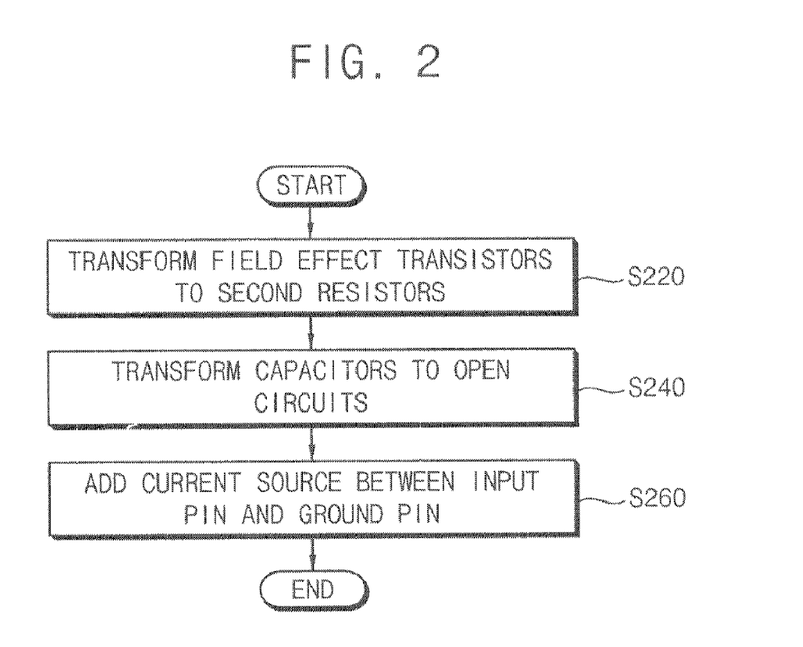
FIG. 2 is a flow diagram further illustrating the step of converting a first net-list to a second net-list in the method of FIG. 1.

FIG. 2 is a flow diagram further illustrating the step of converting the first net-list to the second net-list in the method of FIG. 1. Referring to FIG. 2, FETs are first transformed to second resistors (S220). Capacitors are transformed to the open circuits (S240), and at least one current source is added between an input pin and ground (S260).

Each FET in the first net-list may be transformed to a second resistor in the second net-list (S220) based on a voltage difference between the drain and source terminals of the FET, or based on a drain current of the FET. Each capacitor in the first net-list may essentially be removed (as an open circuit) during transformation (S240) by removing the capacitor from the first net-list.

The current source is added between the input pin and ground in the first net-list (S260). In certain embodiments of the inventive concept, the current source is assumed to provide a current having a maximum value equal to the discharge current caused by an assumed ESD. The maximum value of the discharge current may be selected according to any number of conventionally understood ESD damage models, including a human body model (HBM), a charged device model (CDM), a machine model (MM), etc. For example, the current source may provide a current of 1.3 A when the human body model (HBM) 2000V is assumed. As a result, the second net-list, as converted from the first net-list, includes only first resistors, second resistors, and the current source for direct current analysis. In circumstances where the first net-list includes other types of elements in addition to FETS and CAPS, these other elements may be similarly transformed for the direct current analysis. For example, inductors in the first net-list may be transformed to short circuits in the second net-list.

Figure 3:
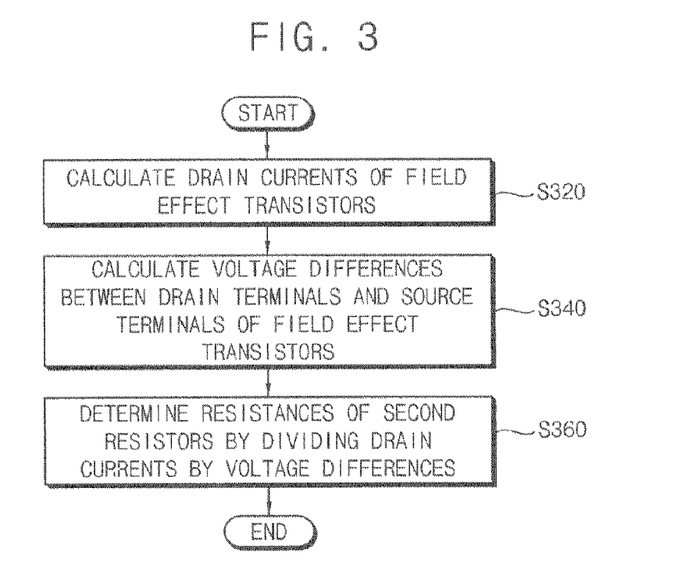
FIG. 3 is a flow diagram further illustrating a process by which field effect transistors are transformed to second resistors in the method of FIG. 1.

FIG. 3 is a flow diagram further illustrating the step of transforming FETS to second resistors within the method of FIG. 1.

Referring to FIG. 3, corresponding drain currents for the FETs are calculated (S320). For example, the drain currents may be calculated via one or more conventionally understood simulation(s) run on the first net-list.

Then, voltage differences between respective drain and source terminals for the FETs are then calculated (S340). Here again, the voltage differences for the FETs may be calculated by running a simulation on the first net-list.

Finally, the resistances of the second resistors in the second net-list are determined by (e.g.,) dividing the drain currents by the voltage differences (S360).

In this manner, a second net-list may be obtained which includes only second information related to first resistors, second resistors, and current source(s)—each susceptible to direct current analysis. In other embodiments of the inventive concept, certain variables including conditional values, weighting values, etc., may be applied to FETs during transformation to corresponding second resistors.

Figure 4:
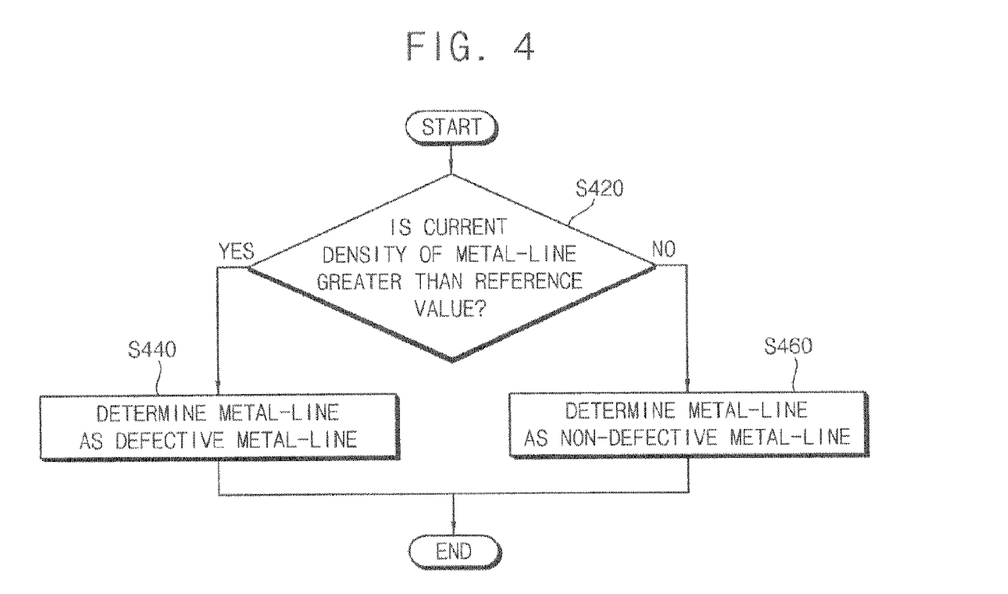
FIG. 4 is a flow diagram further illustrating the detection of defective metal lines among metal lines based on current densities of the metal lines in the method of FIG. 1.

FIG. 4 is a flow diagram further illustrating the detection of defective metal lines from among metal lines based on current densities of the metal lines in the method of FIG. 1.

Referring to FIG. 4, a metal line may be determined to be a defective metal lines or non-defective metal lines based on one or more current densities associated with the metal line. In the illustrated embodiment of FIG. 4, a current density associated with the first resistor value of the FET is compared to a reference value (S420). If the current density is greater than the reference value (S420=YES), then the metal line is determined to be defective (S440). Otherwise (S420=NO), the metal line is determined to be non-defective (S460). As described above, each current density for a corresponding metal line may be calculated by dividing current flowing through the metal line by the width of the metal line when direct current analysis is performed on the second net-list. The reference value may be defined in certain embodiments as a current density likely to cause failure of the metal line. Of note, each reference value used for determination of metal line failure may be adjusted according to full-chip design conditions and factors.

Figure 5A:
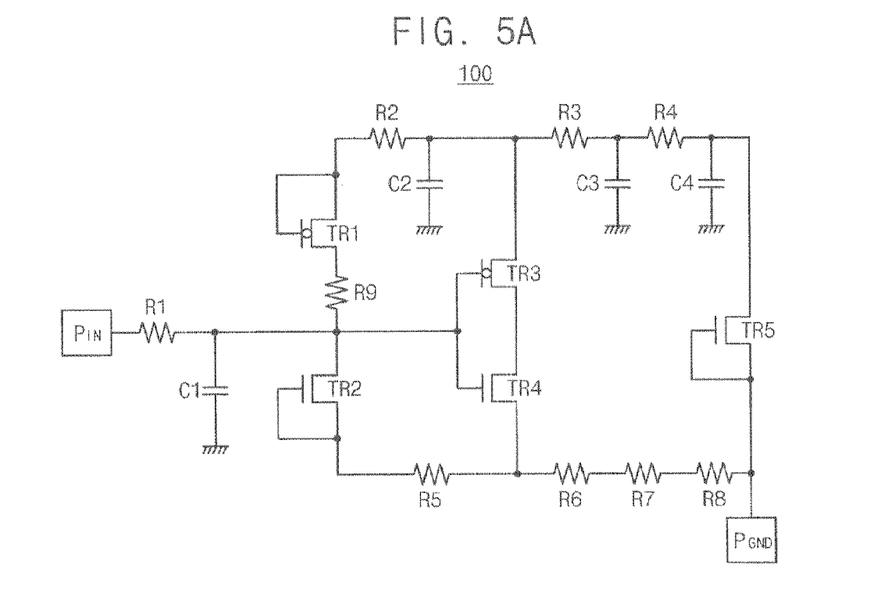
FIG. 5A is a circuit diagram illustrating one example of a first net-list.
Figure 5B:
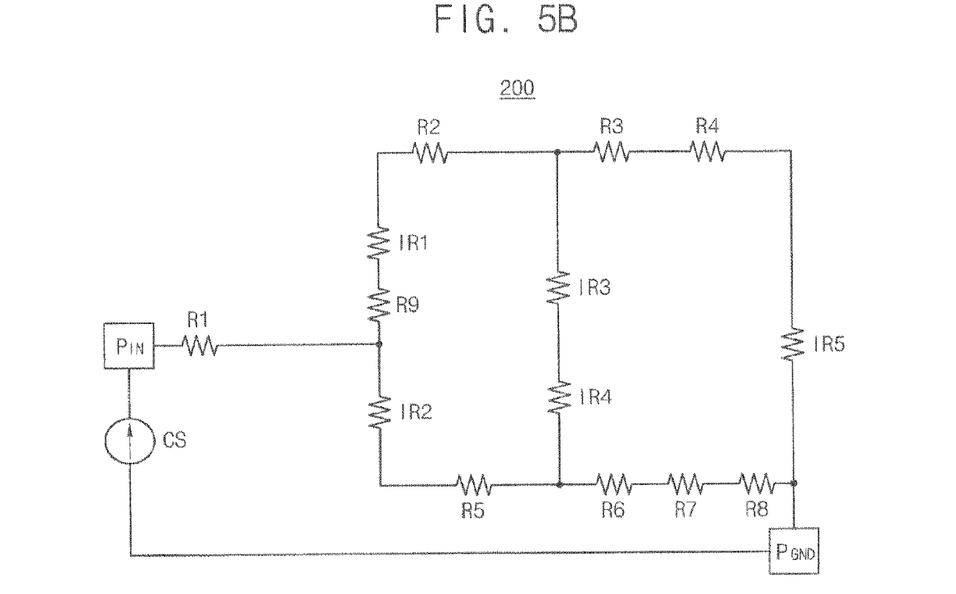
FIG. 5B is a circuit diagram illustrating one example of a second net-list converted from the first net-list of FIG. 5A.

FIG. 5A is a circuit diagram illustrating one example of a first net-list. FIG. 5B is a circuit diagram illustrating one example of a second net-list converted from the first net-list of FIG. 5A.

Referring to FIG. 5A and FIG. 5B, a first net-list 100 comprises first information related to elements and metal lines. The elements include FETs TR1 through TR5 and CAPs C1 through C4. The metal lines correspond to first resistors R1 through R9. A corresponding (post-transformation) second net-list 200 comprises second information related to first resistors R1 through R1, second resistors IR1 through IR5, and a current source CS.

Thus, the first net-list 100 may be converted to the second net-list 200 prior to direct current analysis. The FETs TR1 through TR5 in the first net-list 100 are transformed to the second resistors IR1 through IR5 in the second net-list 200 based on drain currents of the FETs TR1 through TR5, and voltage differences between drain terminals and source terminals of the FETs TR1 through TR5. Here, the drain currents of the FETs TR1 through TR5 and the voltage differences of the FETs TR1 through TR5 are calculated by performing a simulation on the first net-list 100. Resistances of the second resistors IR1 through IR5 are determined by dividing the drain currents of the FETs TR1 through TR5 by the voltage differences of the FETs TR1 through TR5. The CAPs C1 through C4 in the first net-list 100 are converted to open circuits in the second net-list 200 because current is assumed not to flow in relation to the CAPs C1 through C4 during the direct current analysis. The current source CS is added between an input pin $P_{IN}$ and a ground pin $P_{GND}$ in the second net-list. The current source CS provides a discharge current having a value defined in relation to an assumed ESD event or model. For example, the current source CS may provide a current having 1.3 A when a human body model (HBM) 2000V is assumed. As described above, the direct current analysis may be readily performed on the second net-list 200 because the second net-list 200 includes only first resistors R1 through R9 corresponding to the metal lines, second resistors IR1 through IR5 corresponding to the FETs TR1 through TR5, and the current source CS. Thus, defective metal lines may be detected from among the metal lines based on the current densities of the metal lines by performing the direct current analysis on the second net-list 200. Further, when the first net-list 100 includes other elements (e.g., inductors) in addition to the FETs TR1 through TR5 and the CAPs C1 through C4, other elements may also be transformed for the direct current analysis in the second net-list 200.

Figure 6:
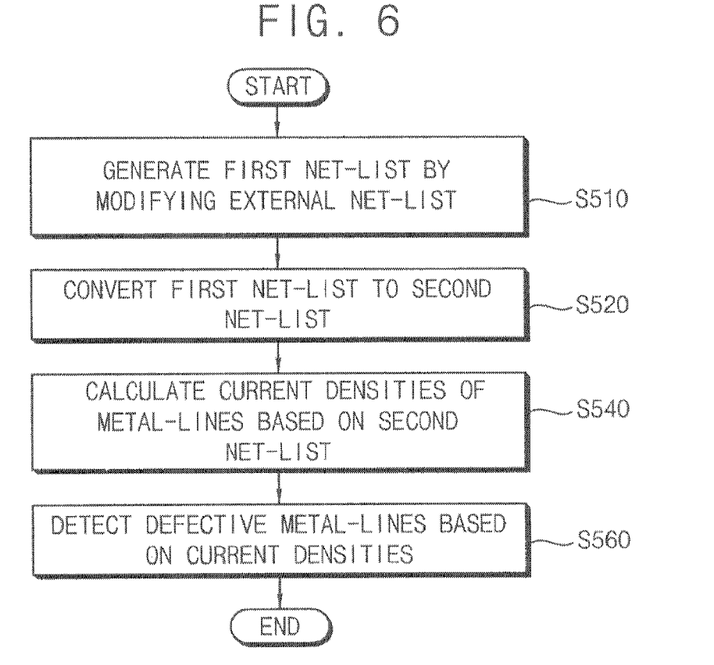
FIGS. 6, 7, and 8 are flow diagrams respectively summarizing methods of detecting metal line failures in a full-chip according to certain embodiments of the inventive concept.

FIG. 6 is a flow diagram summarizing a method of detecting metal line failures in a full-chip according to embodiments of the inventive concept.

Referring to FIG. 6, in the method of detecting metal line failures for a full-chip a first net-list is generated by modifying an external net-list inputted from an external device (S510). The first net-list is converted to a second net-list (S520). Current densities of metal lines are calculated by performing a direct current analysis on the second net-list (S540). Defective metal lines are detected among the metal lines based on the current densities of the metal lines (S560).

The first net-list is generated by modifying the external net-list inputted from the external device (S510). The first net-list includes first information related to elements and metal lines. The elements correspond to FETs and CAPs. The metal lines correspond to first resistors. The external net-list may not be compatible with the first net-list because formats of net-lists are differed according to applications or devices. Thus, the external net-list is required to be modified to be compatible with the first net-list. After the first net-list is generated from the external net-list, the first net-list is converted to the second net-list (S520). The second net-list includes second information for the direct current analysis. Then, the current densities of the metal lines are calculated by performing the direct current analysis on the second net-list (S540). The defective metal lines are detected among the metal lines based on the current densities of the metal lines (S560).

Figure 7:
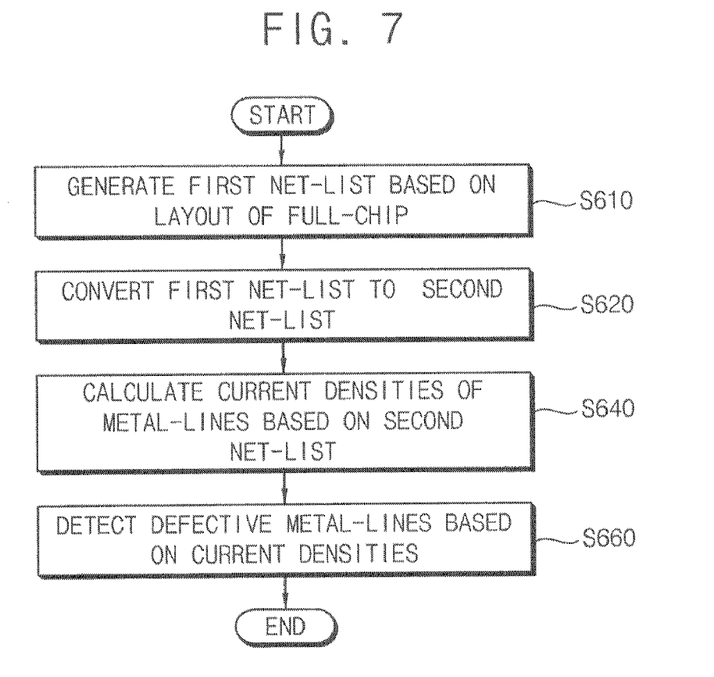

FIG. 7 is a flow diagram illustrating a method of detecting metal line failures in a full-chip according to another embodiment of the inventive concept.

Referring to FIG. 7, in the method of detecting metal line failures for a full-chip according to some example embodiments, a first net-list may be generated based on a layout of the full-chip (S610). The first net-list may be converted to a second net-list (S620). Current densities of metal lines may be calculated by performing a direct current analysis on the second net-list (S640). Defective metal lines may be detected among the metal lines based on the current densities of the metal lines (S660).

The first net-list is generated based on the layout of the full-chip (S610). The first net-list includes first information related to elements and metal lines. Generally, the full-chip includes the elements corresponding to FETs and CAPs, and the metal lines corresponding first resistors. Thus, the first net-list is generated based on the layout of the full-chip including information related to the FETs, the CAPs, and the first resistors. For example, the information related to the FETs, the CAPs, and the first resistors may include position information, width information, length information, and etc. After the first net-list is generated based on the layout of the full-chip, the first net-list is converted to the second net-list (S620). The second net-list includes second information for the direct current analysis. Then, the current densities of the metal lines are calculated by performing the direct current analysis on the second net-list (S640). The defective metal lines are detected among the metal lines based on the current densities of the metal lines (S660).

Figure 8:
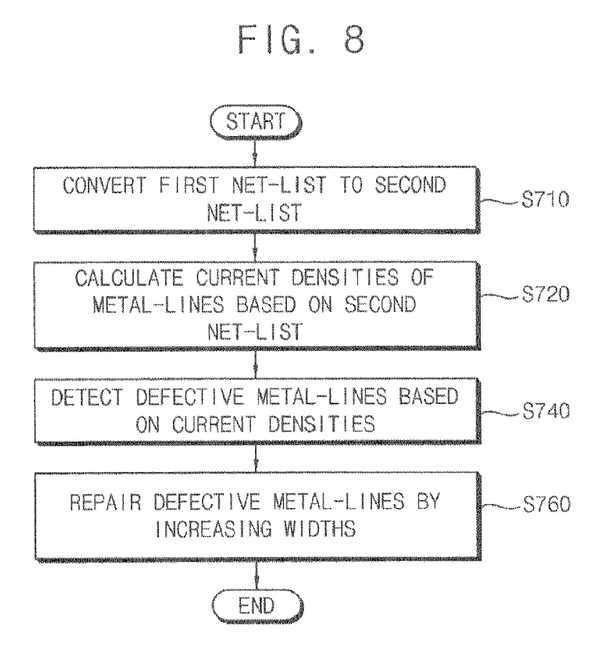

FIG. 8 is a flow diagram illustrating a method of detecting metal line failures in a full-chip according to another embodiment of the inventive concept.

Referring to FIG. 8, in the method of detecting metal line failures for a full-chip according to some example embodiments, a first net-list may be converted to a second net-list (S710). The first net-list may include first information related to elements and metal lines. The second net-list may include second information for a direct current analysis. The elements may correspond to FETs and CAPs. The metal lines may correspond to metal lines. Current densities of the metal lines may be calculated by performing the direct current analysis on the second net-list (S720). Defective metal lines may be detected among the metal lines based on the current densities of the metal lines (S740). Then, widths of the defective metal lines (i.e., substantially cross sectional areas of the defective metal lines) may be increased to repair the defective metal lines (S760).

The widths of the defective metal lines are increased to repair the defective metal lines, respectively (S760). The currents densities of the metal lines are calculated by dividing currents flowing through the metal lines by widths of the metal lines (i.e., substantially cross sectional areas of the metal lines). The current densities of the metal lines become smaller as the widths of the metal lines are increased. Thus, the defective metal lines may be repaired by increasing the widths of the defective metal lines. Accordingly, the method of FIG. 8 may detect the metal line failures, and further may prevent the metal line failures in the full-chip design phase.

Figure 9:
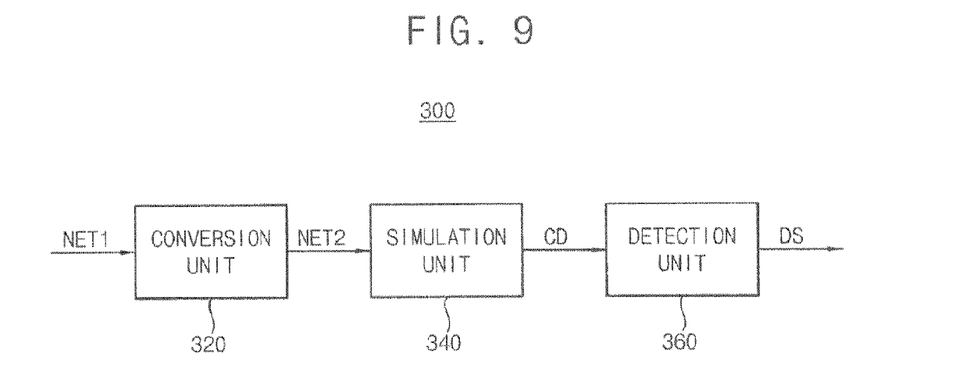
FIGS. 9, 10, 11, 12 and 13 are block diagrams illustrating systems detecting metal line failures in a full-chip according to certain embodiments of the inventive concept.

FIG. 9 is a block diagram illustrating a system of detecting metal line failures in a full-chip according to an embodiment of the inventive concept.

Referring to FIG. 9, a system 300 comprises a conversion unit 320, a simulation unit 340, and a detection unit 360.

The conversion unit 320 receives a first net-list NET1, and converts the first net-list NET1 to a second net-list NET2. The first net-list NET1 may include first information related to elements and metal lines. The second net-list NET2 may include second information for a direct current analysis. The elements may correspond to FETs and CAPs. The metal lines may correspond to first resistors. The conversion unit 320 transforms the FETs in the first net-list NET1 to second resistors in the second net-list NET2. Resistances of the second resistors are determined by dividing drain currents of the FETs by voltage differences between drain terminals and source terminals of the FETs. The conversion unit 320 transforms the CAPs in the first net-list NET1 to open circuits in the second net-list NET2. That is, the CAPs are removed from the first net-list NET1. The conversion unit 320 adds a current source between an input pin and a ground pin in the first net-list NET1. The current source may provide a current having a maximum value of discharge currents caused by an ESD event. For example, the current source may provide a current having 1.3 A when a human body model (HBM) 2000V is assumed. Further, the conversion unit 320 may transform other elements for the direct current analysis when the first net-list NET1 includes other elements (e.g., inductors). As a result, the second net-list NET2 converted from the first net-list NET1 includes the second information related to the first resistors, the second resistors, and the current source for the direct current analysis.

The simulation unit 340 receives the second net-list NET2, and performs the direct current analysis on the second net-list NET2 to outputs current densities CD of the metal lines (i.e., the first resistors). The current densities CD of the metal lines are calculated by dividing currents flowing through the metal lines by widths of the metal lines. As described above, the current densities CD of the metal lines are calculated by a quantitative analysis because the second net-list NET2 just includes the second information related to the first resistors, the second resistors, and the current source.

The detection unit 360 receives the current densities CD of the metal lines, and detects defective metal lines among the metal lines based on the current densities CD of the metal lines to output detection signals DS. Excessive currents flowing through the metal lines may be generated by an ESD event. As a result, the metal line failures may be caused when the current densities CD of the metal lines are greater than a reference value. Thus, the detection unit 360 determines the metal lines as defective metal lines or non-defective metal lines based on whether the current densities CD of the metal lines are greater than the reference value. The reference value corresponds to a current density that causes the metal line failures. As described above, the reference value may be adjusted according to full-chip design conditions.

Accordingly, the system 300 of FIG. 9 may rapidly and accurately detect the metal line failures, and may detect even metal line failures of an internal circuit by determining the metal lines as the defective metal lines or the non-defective metal lines using the quantitative analysis (i.e., the direct current analysis).

Figure 10:
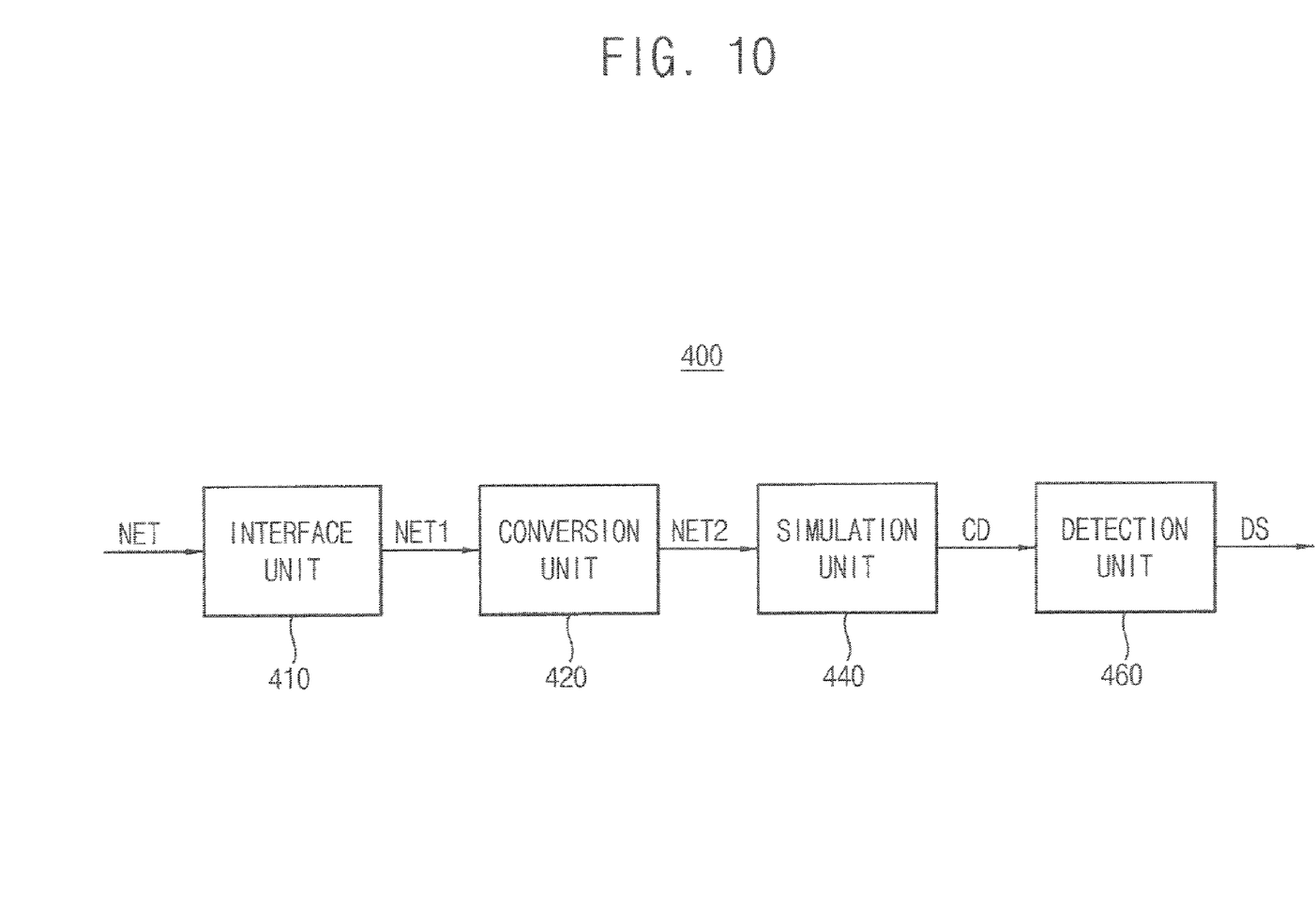

FIG. 10 is a block diagram illustrating a system of detecting metal line failures in a full-chip according to another embodiment of the inventive concept.

Referring to FIG. 10, a system 400 comprises an interface unit 410, a conversion unit 420, a simulation unit 440, and a detection unit 460.

The interface unit 410 generates a first net-list NET1 by modifying an external net-list NET inputted from an external device, and outputs the first net-list NET1 to the conversion unit 420. The external net-list NET may not be compatible with the first net-list NET1 because formats of net-lists are differed according to applications or devices. Thus, the interface unit 410 is required to modify the external net-list NET to be compatible with the first net-list NET1. After the first net-list NET1 is generated from the external net-list NET in the interface unit 410, the conversion unit 420 receives the first net-list NET1 from the interface unit 410, and converts the first net-list NET1 to a second net-list NET2. The first net-list NET1 may include first information related to elements and metal lines. The second net-list NET2 may include second information for a direct current analysis. The elements may correspond to FETs and CAPs. The metal lines may correspond to first resistors. The simulation unit 440 receives the second net-list NET2 from the conversion unit 420, and performs the direct current analysis on the second net-list NET2 to output current densities CD of the metal lines (i.e., the first resistors) to the simulation unit 440. The detection unit 460 receives the current densities CD of the metal lines from the simulation unit 440 and detects defective metal lines among the metal lines based on the current densities CD of the metal lines to output detection signals DS. The detail descriptions of the conversion unit 420, the simulation unit 440, and the detection unit 460 will be omitted since corresponding detail descriptions of the conversion unit 420, simulation unit 440, and detection unit 460 are described above.

Figure 11:
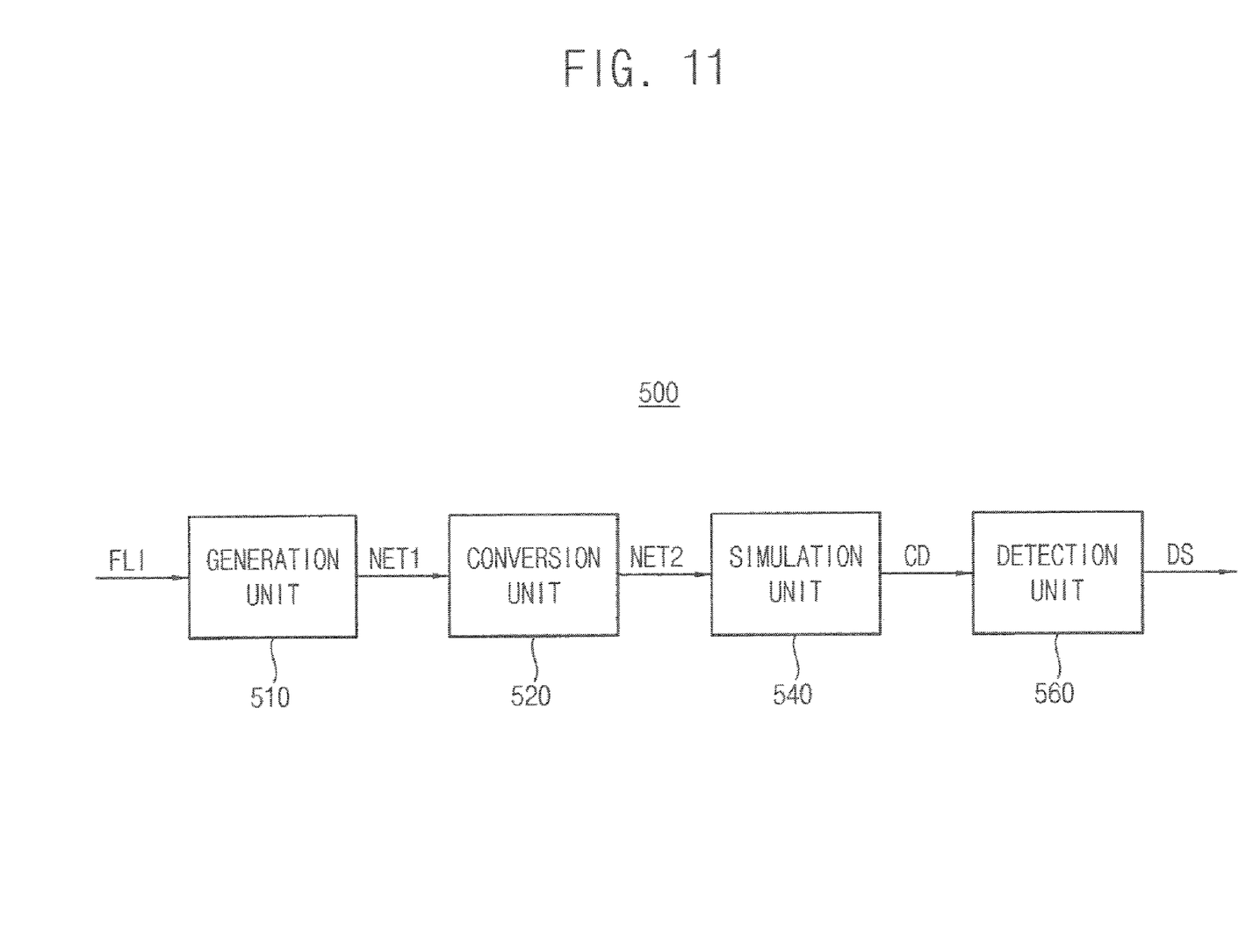

FIG. 11 is a block diagram illustrating a system for detecting metal line failures in a full-chip according to another embodiment of the inventive concept.

Referring to FIG. 11, a system 500 comprises a generation unit 510, a conversion unit 520, a simulation unit 540, and a detection unit 560.

The generation unit 510 generates a first net-list NET1 based on a layout FLI of the full-chip, and outputs the first net-list NET1 to the conversion unit 520. The first net-list may include first information related to elements and metal lines. The full-chip may include the elements corresponding to FETs, CAPs, and metal lines corresponding first resistors. The first net-list NET1 may include information related to FETs, CAPs, and metal lines. For example, the information related to FETs, CAPs, and metal lines may include position information, width information, length information, and etc. After the generation unit 510 generates the first net-list NET1 based on the layout FLI of the full-chip, the conversion unit 520 receives the first net-list NET1, and converts the first net-list NET1 to a second net-list NET2. The first net-list NET1 includes first information related to the elements and the metal lines. The second net-list NET2 includes second information susceptible to direct current analysis. The simulation unit 540 receives the second net-list NET2 from the conversion unit 520, and performs a direct current analysis on the second net-list NET2 to output current densities CD of the metal lines (i.e., the first resistors) to the simulation unit 540. The detection unit 560 receives the current densities CD of the metal lines from the simulation unit 540, detects defective metal lines among the metal lines based on the current densities CD of the metal lines, and outputs detection signals DS. The detail descriptions of the conversion unit 520, the simulation unit 540, and the detection unit 560 will be omitted since corresponding detail descriptions of the conversion unit 520, the simulation unit 540, and the detection unit 560 are described above.

Figure 12:
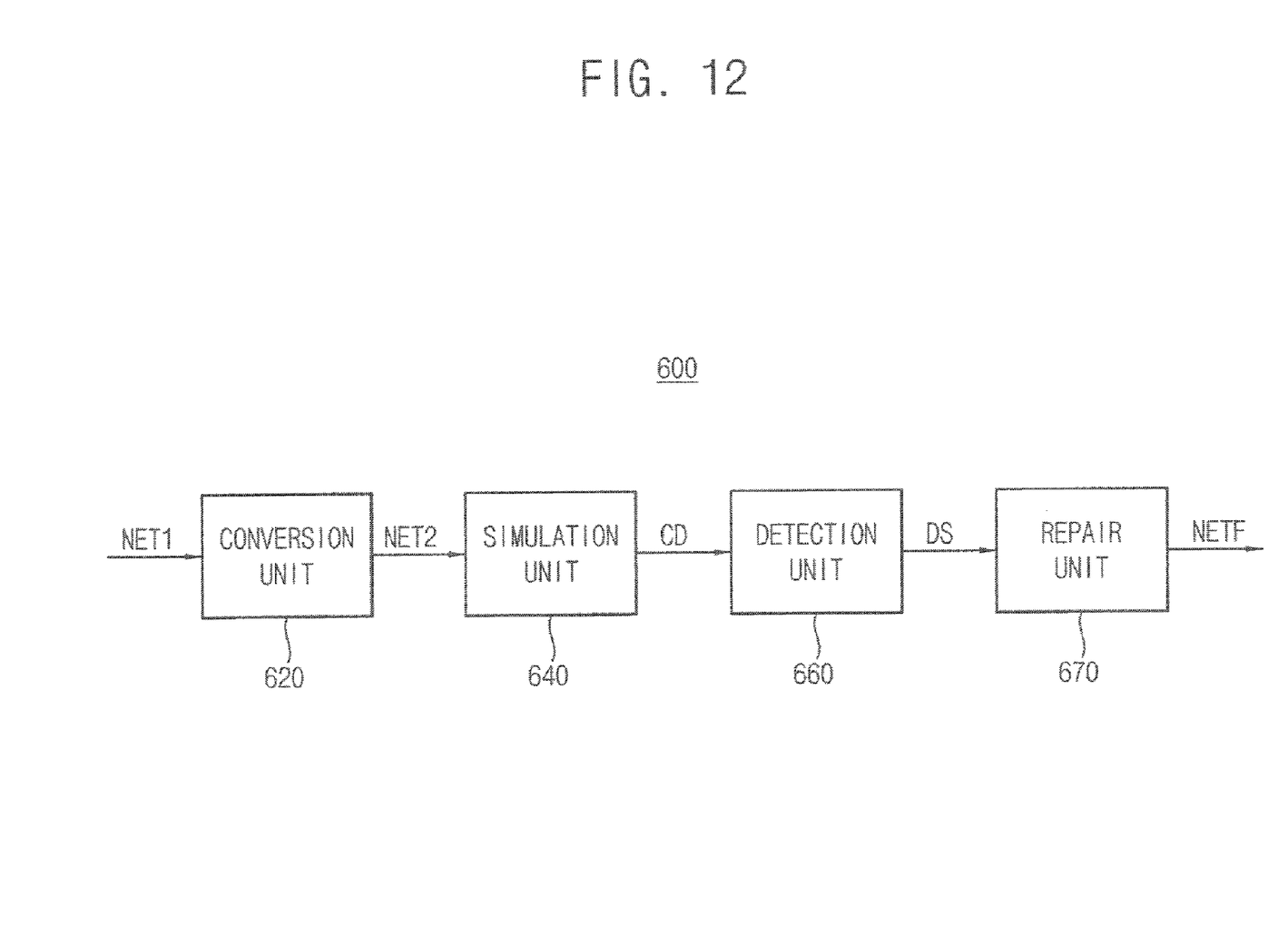

FIG. 12 is a block diagram illustrating a system for detecting metal line failures in a full-chip according to another embodiment of the inventive concept.

Referring to FIG. 12, a system 600 comprises a conversion unit 620, a simulation unit 640, a detection unit 660, and a repair unit 670.

The conversion unit 620 receives a first net-list NET1, and converts the first net-list NET1 to a second net-list NET2. The first net-list NET1 includes first information related to elements and metal lines. The second net-list NET2 includes second information susceptible to direct current analysis. The elements may correspond to FETs and CAPs. The metal lines may correspond to first resistors. The simulation unit 640 receives the second net-list NET2 from the conversion unit 620, and performs the direct current analysis on the second net-list NET2 to output current densities CD of the metal lines (i.e., the first resistors). The detection unit 660 receives the current densities CD of the metal lines from the simulation unit 640, detects defective metal lines among the metal lines based on the current densities CD of the metal lines, and outputs detection signals DS. The repair unit 670 repairs the defective metal lines by increasing widths of the defective metal lines in the first net-list NET1 based on the detection signals DS. Then, the repair unit 670 outputs a final net-lest NETF. As described above, the current densities CD of the metal lines are calculated by dividing currents flowing through the metal lines by the widths of the metal lines. Thus, the current densities CD of the metal lines may become smaller as the widths of the metal lines are increased. That is, the defective metal lines may be repaired when the widths of the defective metal lines are increased. Accordingly, the system of FIG. 12 may detect the metal line failures, and prevent the metal line failures in the full-chip design phase. The detail descriptions of the conversion unit 620, the simulation unit 640, and the detection unit 660 will be omitted since corresponding detail descriptions of the conversion unit 620, the simulation unit 640, and the detection unit 660 are described above.

Figure 13:
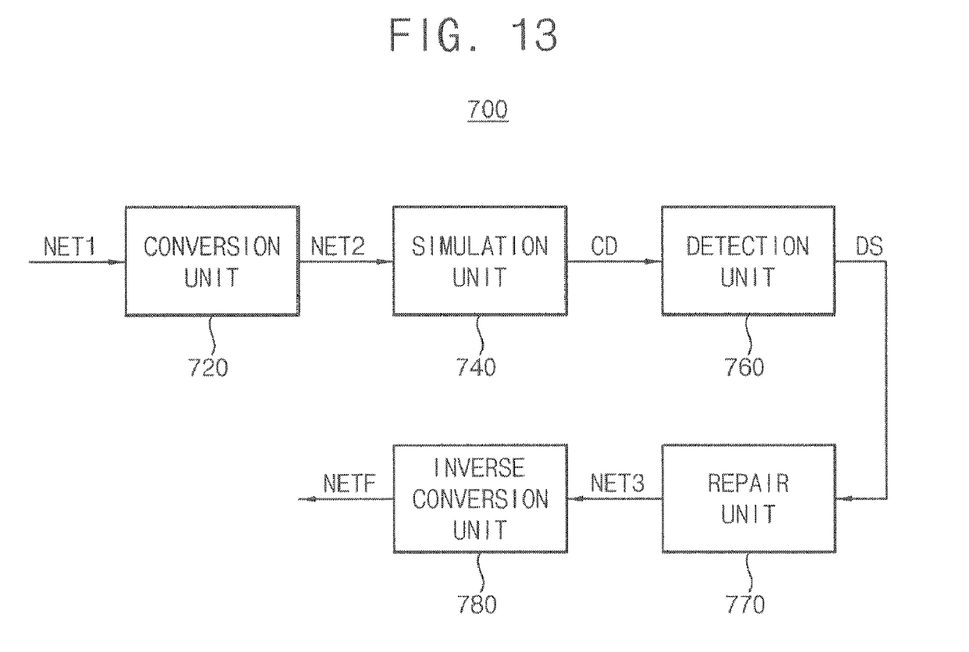

FIG. 13 is a block diagram illustrating a system for detecting metal line failures in a full-chip according to another embodiment of the inventive concept.

Referring to FIG. 13, a system 700 comprises a conversion unit 720, a simulation unit 740, a detection unit 760, a repair unit 770, and an inverse conversion unit 780.

The conversion unit 720 receives a first net-list NET1, and converts the first net-list NET1 to a second net-list NET2. The first net-list NET1 includes first information related to elements and metal lines. The second net-list NET2 includes second information susceptible to direct current analysis. The elements may correspond to FETs and CAPs. The metal lines may correspond to first resistors. The simulation unit 740 receives the second net-list NET2 from the conversion unit 720, and performs the direct current analysis on the second net-list NET2 to output current densities CD of the metal lines to the detection unit 760. The detection unit 760 receives the current densities CD of the metal lines from the simulation unit 740, detects defective metal lines among the metal lines based on the current densities CD of the metal lines, and outputs detection signals DS. The repair unit 770 repairs the defective metal lines by increasing widths of the defective metal lines in the second net-list NET2 based on the detection signals DS. Then, the repair unit 770 outputs a third net-list NET3 to the inverse conversion unit 780. The inverse conversion unit 780 receives the third net-list from the repair unit 770, and converts the third net-list NET3 to the first net-list NET1 to output a final net-list NETF. That is, the inverse conversion unit 780 transforms the second resistors to the FETs, transforms the open circuits to the CAPs, and removes the current source from the third net-list NET3. Accordingly, the system of FIG. 13 may detect the metal line failures, and prevent the metal line failures in the full-chip design phase. The detail descriptions of the conversion unit 720, the simulation unit 740, and the detection unit 760 will be omitted since corresponding detail descriptions of the conversion unit 720, the simulation unit 740, and the detection unit 760 are described above.

Figure 14:
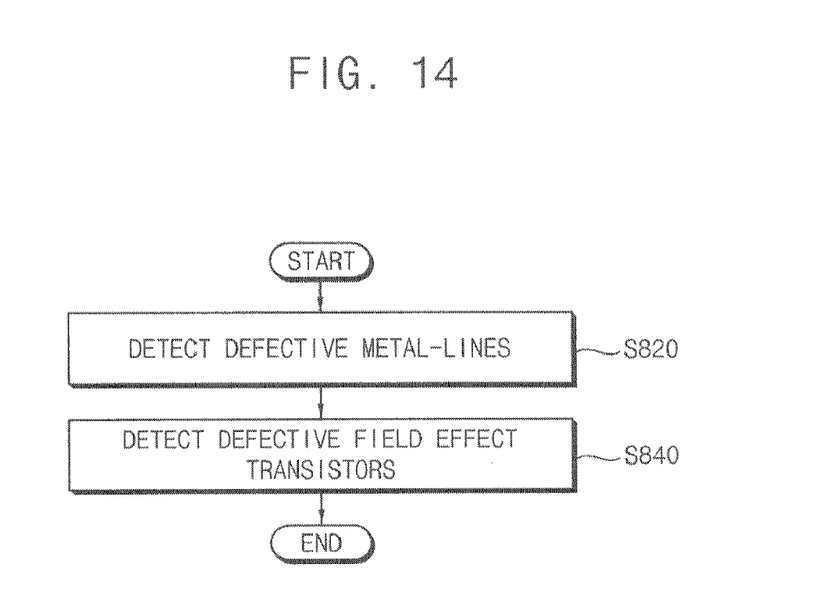
FIG. 14 is a flow diagram generally summarizing a method of detecting full-chip failures in a full-chip according to an embodiment of the inventive concept.

FIG. 14 is a flow diagram generally illustrating a method of detecting full-chip failures in a full-chip according to an embodiment of the inventive concept.

Referring to FIG. 14, the method comprises detecting defective metal lines based on a direct current analysis performed on a second net-list that is converted from a first net-list (S820). The first net-list includes first information related to elements and metal lines, and the second net-list includes second information susceptible to direct current analysis. The elements may correspond to FETs and CAPs. The metal lines may correspond to first resistors. Defective FETs may be detected based on an element analysis performed on a fourth net-list that is converted from the first net-list (S840). The fourth net-list may be generated by transforming the FETs to modeling circuits in the first net-list. The method of FIG. 14 may detect field effect transistor failures as well as metal line failures in a full-chip design phase. Hereinafter, the method of FIG. 14 will be described in some additional detail.

The defective metal lines are detected based on the direct current analysis performed on the second net-list (S820). In one embodiment of the inventive concept, the first net-list is generated by modifying an external net-list inputted from an external device. In another embodiment, the first net-list is generated based on a layout of the full-chip. The second net-list is generated by transforming the FETs to first resistors, the CAPs to open circuits, and adding a current source between an input pin and a ground pin in the first net-list. The current source may provide a current having a maximum value of discharge currents caused by an ESD event. Then, current densities of the metal lines are calculated by performing the direct current analysis on the second net-list. The metal lines are determined as defective metal lines or non-defective metal lines based on whether the current densities of the metal lines (i.e., the first resistors) are greater than a reference value.

The defective FETs are detected based on the element analysis performed on the fourth net-list (S840). The fourth net-list is generated by transforming the FETs to the modeling circuits in the first net-list. Then, a simulation (i.e., the element analysis) is performed on the fourth net-list. The FETs are determined as defective FETs or non-defective FETs based on the simulation result. The detail description of the element analysis will be omitted since such analysis is conventionally understood. Further, the defective FETs may be repaired by changing characteristics of the defective FETs. The defective metal lines may be repaired by increasing widths of the defective metal lines. However, repairing manners of the defective FETs and the defective metal lines are not limited thereto.

As described above, embodiments of the inventive concept include methods of detecting metal line failures for a full-chip design, and systems for detecting metal line failures for the full-chip design that enable a full-chip design to be performed in consideration of certain ESD events within a full-chip design phase. Accordingly, methods of detecting metal line failures for a full-chip according to some example embodiments, systems of detecting metal line failures for a full-chip according to some example embodiments, and methods of detecting full-chip failures for a full-chip according to some example embodiments may be applied to computer programs for a full-chip design, storage media recording the computer programs, computer systems performing computer programs, and etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of detecting metal line failures in a full-chip, the method comprising:
    converting a first net-list to a second net-list, the first net-list having first information related to elements and metal lines, and the second net-list having second information susceptible to direct current analysis;
    calculating current densities for the metal lines by performing the direct current analysis on the second net-list; and
    detecting, using a computer, defective metal lines among the metal lines based on the current densities of the metal lines,
    wherein a current source provides a current having a maximum value of discharge currents caused by an electro static discharge (ESD) event,
    wherein converting the first net-list to the second net-list comprises:
        transforming the field effect transistors to second resistors;
        transforming the capacitors to open circuits; and
        adding the current source between an input pin and a ground pin, and
    wherein transforming the field effect transistors to the second resistors comprises:
        calculating drain currents for the field effect transistors;
        calculating voltage differences between drain terminals and source terminals of the field effect transistors; and
        determining resistances of the second resistors by dividing the drain currents by the voltage differences.

2. The method of claim 1, further comprising:
    generating the first net-list by modifying an externally supplied net-list.

3. The method of claim 1, further comprising:
    generating the first net-list based on a layout of the full-chip.

4. The method of claim 1, wherein the elements correspond to field effect transistors and capacitors, and the metal lines correspond to first resistors.

5. The method of claim 1, wherein detecting the defective metal lines among the metal lines comprises determining the metal lines as the defective metal lines when the current densities of the metal lines are greater than a reference value.

6. The method of claim 5, further comprising:
    increasing widths of the defective metal lines to repair the defective metal lines.

7. A system of detecting metal line failures in a full-chip, the system comprising:
    a conversion unit configured to convert a first net-list to a second net-list, the first net-list having first information related to elements and metal lines, the second net-list having second information susceptible to direct current analysis, the elements corresponding to field effect transistors and capacitors, and the metal lines corresponding to first resistors;
    a simulation unit configured to calculate current densities of the metal lines by performing the direct current analysis on the second net-list; and
    a detection unit configured to detect defective metal lines among the metal lines based on the current densities of the metal lines, the metal lines being determined as the defective metal lines when the current densities of the metal lines are greater than a reference value,
    wherein the conversion unit is further configured to transform the field effect transistors to second resistors, transform the capacitors to open circuits, and add a current source between an input pin and a ground pin,
    wherein the current source provides a current having a maximum value of discharge currents caused by an electro static discharge (ESD) event, and
    wherein the conversion unit is further configured to calculate drain currents of the field effect transistors, calculate voltage differences between drain terminals and source terminals of the field effect transistors, and determine resistances of the second resistors by dividing the drain currents by the voltage differences.

8. The system of claim 7, further comprising:
    an interface unit configured to generate the first net-list by modifying an externally provided net-list.

9. The system of claim 7, further comprising:
    a generation unit configured to generate the first net-list based on a layout of the full-chip.

10. The system of claim 7, further comprising:
    a repair unit configured to generate a final net-list from the first net-list by increasing widths of the defective metal lines to repair the defective metal lines.

11. The system of claim 7, further comprising:
    a repair unit configured to generate a third net-list from the second net-list by increasing widths of the defective metal lines to repair the defective metal lines.

12. The system of claim 11, further comprising:
    an inverse conversion unit configured to generate a final net-list from the third net-list by transforming the second resistors to the field effect transistors, transforming the open circuits to the capacitors, and removing the current source.

13. A method of detecting full-chip failures in a full-chip, the method comprising:
- detecting defective metal lines by performing a direct current analysis on a second net-list converted from a first net-list, the first net-list having first information related to elements and metal lines, the second net-list having second information susceptible to direct current analysis, the elements corresponding to field effect transistors and capacitors, and the metal lines corresponding to first resistors; and
- detecting, using a computer, defective field effect transistors by performing an element analysis on a fourth net-list, the fourth net-list being converted from the first net-list by transforming the field effect transistors to modeling circuits,
- wherein the second net-list is converted from the first net-list by transforming the field effect transistors to second resistors, transforming the capacitors to open circuits, and adding a current source between an input pin and a ground pin,
- wherein the current source provides a current having a maximum value of discharge currents caused by an electro static discharge (ESD) event, and
- wherein the field effect transistors are transformed to the second resistors by calculating drain currents of the field effect transistors, by calculating voltage differences between drain terminals and source terminals of the field effect transistors, and by dividing the drain currents by the voltage differences to determine resistances of the second resistors.

14. The method of claim 13, wherein detecting the defective metal lines comprises:
- calculating current densities of the metal lines by performing the direct current analysis on the second net-list; and
- detecting the defective metal lines among the metal lines based on the current densities of the metal lines, the metal lines being determined as the defective metal lines when the current densities of the metal lines are greater than a reference value.

* * * * *